(12) United States Patent
Liu et al.

(10) Patent No.: US 11,658,209 B2
(45) Date of Patent: May 23, 2023

(54) METHOD FOR MANUFACTURING A SEMICONDUCTOR SUPER-JUNCTION DEVICE

(71) Applicant: SUZHOU ORIENTAL SEMICONDUCTOR CO., LTD., Jiangsu (CN)

(72) Inventors: Wei Liu, Jiangsu (CN); Lei Liu, Jiangsu (CN); Rui Wang, Jiangsu (CN); Yi Gong, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/611,419

(22) PCT Filed: Sep. 22, 2020

(86) PCT No.: PCT/CN2020/116683
§ 371 (c)(1),
(2) Date: Nov. 15, 2021

(87) PCT Pub. No.: WO2021/223354
PCT Pub. Date: Nov. 11, 2021

(65) Prior Publication Data
US 2023/0052749 A1 Feb. 16, 2023

(30) Foreign Application Priority Data
May 6, 2020 (CN) .......................... 202010372375.6

(51) Int. Cl.
*H01L 21/02* (2006.01)
*H01L 29/06* (2006.01)
(Continued)

(52) U.S. Cl.
CPC .... *H01L 29/0634* (2013.01); *H01L 21/02532* (2013.01); *H01L 21/02579* (2013.01);
(Continued)

(58) Field of Classification Search
None
See application file for complete search history.

(56) References Cited

U.S. PATENT DOCUMENTS

| 5,998,836 | A | 12/1999 | Williams | |
|---|---|---|---|---|
| 2023/0052416 | A1* | 2/2023 | Liu | ..................... H01L 21/3081 |
| 2023/0052749 | A1* | 2/2023 | Liu | ..................... H01L 29/7813 |

FOREIGN PATENT DOCUMENTS

| CN | 108767000 | 11/2018 |
|---|---|---|
| CN | 109830532 | 5/2019 |

(Continued)

OTHER PUBLICATIONS

PCT/CN2020/116683 International Search Report dated Jan. 20, 2021.

*Primary Examiner* — Jack S Chen
(74) *Attorney, Agent, or Firm* — Michael Best & Friedrich LLP

(57) ABSTRACT

Disclosed is a method for manufacturing a semiconductor super-junction device. The method includes: a gate is firstly formed in a gate region of a first trench, then an n-type epitaxial layer is etched with a hard mask layer and an insulating side wall covering a side wall of the gate as masks, and a second trench is formed in the n-type epitaxial layer, and then a p-type column is formed in the first trench and the second trench.

10 Claims, 5 Drawing Sheets

(51) Int. Cl.
*H01L 21/265* (2006.01)
*H01L 21/306* (2006.01)
*H01L 21/308* (2006.01)

(52) U.S. Cl.
CPC .... *H01L 21/26513* (2013.01); *H01L 21/3081* (2013.01); *H01L 21/30604* (2013.01)

(56) References Cited

FOREIGN PATENT DOCUMENTS

DE  102004009323  9/2005
WO  2020084736  4/2020

* cited by examiner

METHOD FOR MANUFACTURING A SEMICONDUCTOR SUPER-JUNCTION DEVICE

CROSS-REFERENCE TO RELATED APPLICATIONS

This is a National Stage Application filed under 35 U.S.C. 371 based on International Patent Application No. PCT/CN2020/116683, filed on Sep. 22, 2020, which claims priority to Chinese Patent Application No. 202010372375.6 filed on May 6, 2020, the disclosures of both of which are incorporated herein by reference in their entireties.

TECHNICAL FIELD

The present disclosure relates to the technical field of a semiconductor super-junction device, and for example, to a method for manufacturing a semiconductor super-junction device.

BACKGROUND

A semiconductor super-junction device is based on a charge balance technology, and can reduce an on resistance and a parasitic capacitance, so that the semiconductor super-junction device has an extremely fast switching characteristic, the switching loss can be reduced, and the higher power conversion efficiency is achieved. A main manufacturing process of the semiconductor super-junction device in the related art includes: firstly, as shown in FIG. 1, a hard mask layer 11 is formed on an n-type epitaxial layer 10, then the hard mask layer 11 is photoetched and etched, an opening is formed in the hard mask layer 11 and a trench 12 is formed in the n-type epitaxial layer 10; next, as shown in FIG. 2, a p-type column 13 is formed in the formed trench through an epitaxial process, and the p-type column 13 is performed a planarization processing, then, as shown in FIG. 3, a gate dielectric layer 14 and a gate 15 are formed through a photoetching process and an etching process once again, and finally, a p-type body region 16 and an n-type source region 17 located in the p-type body region 16 are formed in the n-type epitaxial layer 10. The photoetching process needs to be performed once when the p-type column is formed and then the photoetching process needs to be performed once again when the gate is formed no matter for a planar-type semiconductor super-junction device or a trench-type semiconductor super-junction device, and due to a fact that the photoetching process is high in cost and has the risk of an alignment deviation, therefore, the manufacturing cost and the manufacturing risk of the semiconductor super-junction device are relatively high.

SUMMARY

The present disclosure provides a method for manufacturing a semiconductor super-junction device so as to reduce the manufacturing cost of the semiconductor super-junction device and reduce the manufacturing risk of the semiconductor super-junction device.

The present disclosure provides a method for manufacturing a semiconductor super-junction device. The method includes following steps.

A hard mask layer is formed on an n-type epitaxial layer, a position of a p-type column is defined through a photoetching process, then the hard mask layer is etched, and at least one opening is formed in the hard mask layer, where the at least one opening corresponds to the position of the p-type column.

The n-type epitaxial layer is etched with the hard mask layer as a mask, and a first trench is formed in the n-type epitaxial layer, where a width of the first trench is larger than a width of an opening corresponding to the first trench, and the first trench includes a p-type column region located below the opening corresponding to the first trench and a gate region located on two sides of the p-type column region.

A first insulating layer is formed on a surface of the first trench, a first conductive layer is deposited, and the first conductive layer is etched back so as to form a gate in the gate region of the first trench.

An insulating side wall is formed on an exposed side wall of the gate, the n-type epitaxial layer is etched with the hard mask layer and the insulating side wall as masks, and forming a second trench in the n-type epitaxial layer, where the second trench is located below a p-type column region corresponding to the second trench.

The p-type column is formed in the p-type column region and the second trench, and a pn junction structure is formed between the p-type column and the n-type epitaxial layer, where the p-type column is isolated from the gate by the insulating side wall.

In an embodiment, the method for manufacturing a semiconductor super-junction device further includes following steps.

A p-type body region is formed in the n-type epitaxial layer.

An n-type source region is formed in the p-type body region.

In an embodiment, the hard mask layer is a laminated layer of a silicon oxide layer, a silicon nitride layer, and a silicon oxide layer.

In an embodiment, an etching method combining an anisotropic etching and an isotropic etching is adopted when the first trench is formed through an etching.

In an embodiment, the first insulating layer is made of a silicon oxide.

In an embodiment, the first conducting layer is made of a polycrystalline silicon.

In an embodiment, the formed first conductive layer at least fills the gate region of the first trench when the first conductive layer is deposited.

In an embodiment, a width of the second trench is greater than a width of a p-type column region corresponding to the second trench.

In an embodiment, an etching method combining an anisotropic etching and an isotropic etching is adopted when the second trench is formed through an etching.

In an embodiment, the insulating side wall includes a silicon nitride layer.

In an embodiment, the p-type column is made of a p-type polycrystalline silicon.

According to the method for manufacturing the semiconductor super-junction device provided in the present disclosure, the first trench is formed through the photoetching process once, the gate is formed in the gate region of the first trench in a self-alignment manner, then the n-type epitaxial layer is etched with the hard mask layer and the insulating side wall covering a side wall of the gate as the masks so as to form the second trench, and then the p-type column is formed in the first trench and the second trench. According to the method for manufacturing the semiconductor super-junction device, only the photoetching process once is needed when the gate and the p-type column are formed, which can greatly reduce the manufacturing cost of the semiconductor super-junction device, and reduce the manufacturing risk of the semiconductor super-junction device.

DETAILED DESCRIPTION

A technical solution of the present disclosure will now be described in a specific manner in conjunction with the accompanying drawings in embodiments of the present disclosure. Terms such as "having," "including," and "includes" as used in the present disclosure do not preclude the presence or addition of one or more other elements, or combinations thereof. Moreover, in order to illustrate specific embodiments of the present disclosure, the schematic drawings are shown exaggerated in thickness of layers and regions of the present disclosure, and the dimensions of the drawings are not representative of actual dimensions.

FIGS. 4 to 10 are schematic cross-sectional structure diagrams of main structures in a manufacturing process of one embodiment of a method for manufacturing a semiconductor super-junction device provided in the present disclosure.

Figure 1:
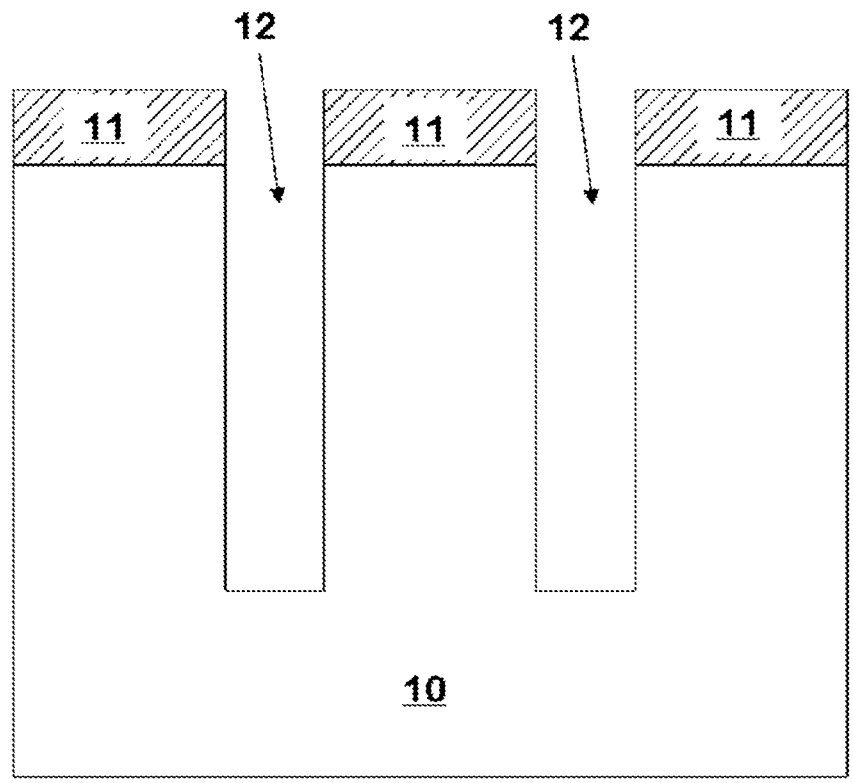
FIGS. 1 to 3 are schematic cross-sectional structure diagrams of main structures in a manufacturing process of a semiconductor super-junction device in the related art.
Figure 2:
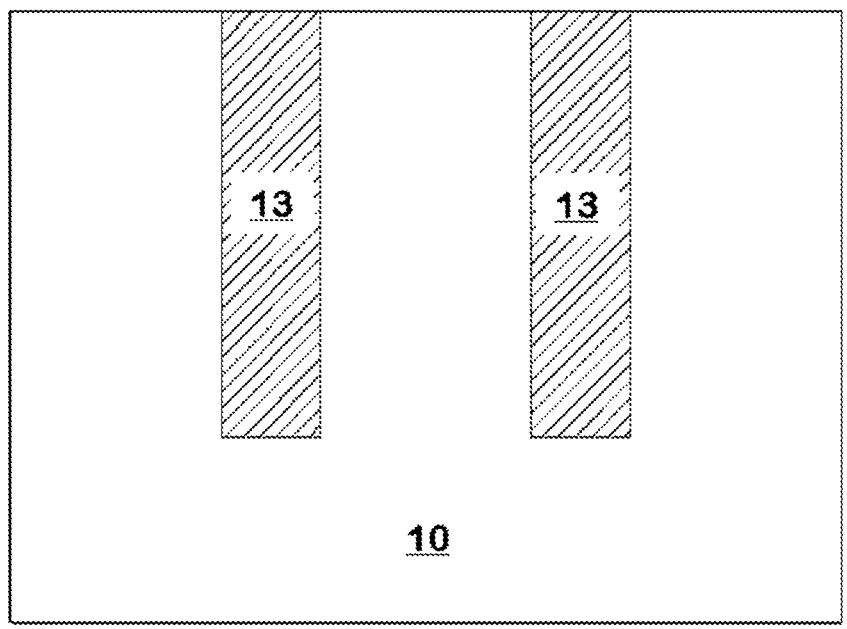
Figure 3:
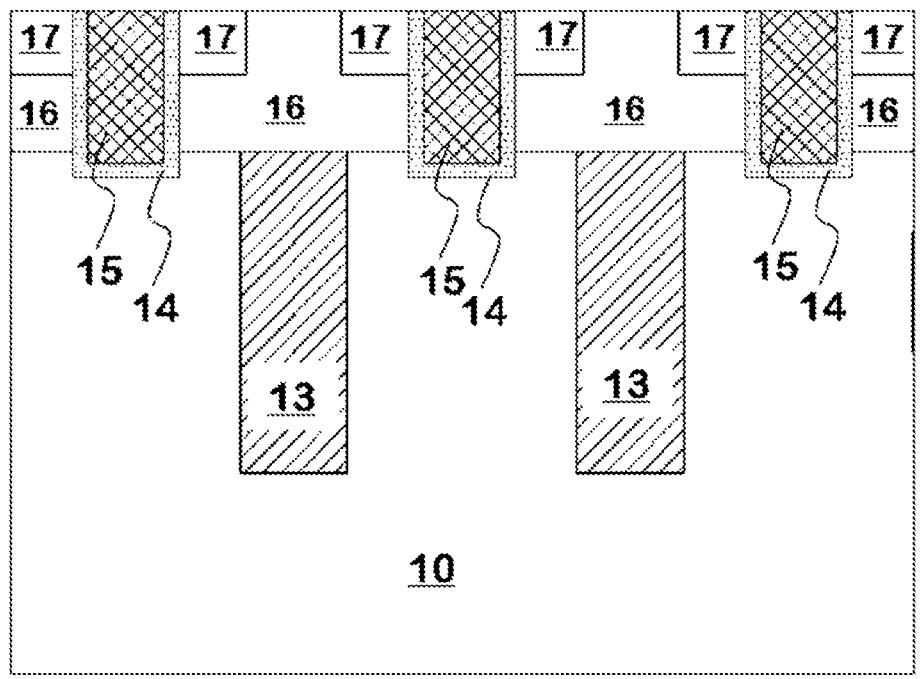
Figure 4:
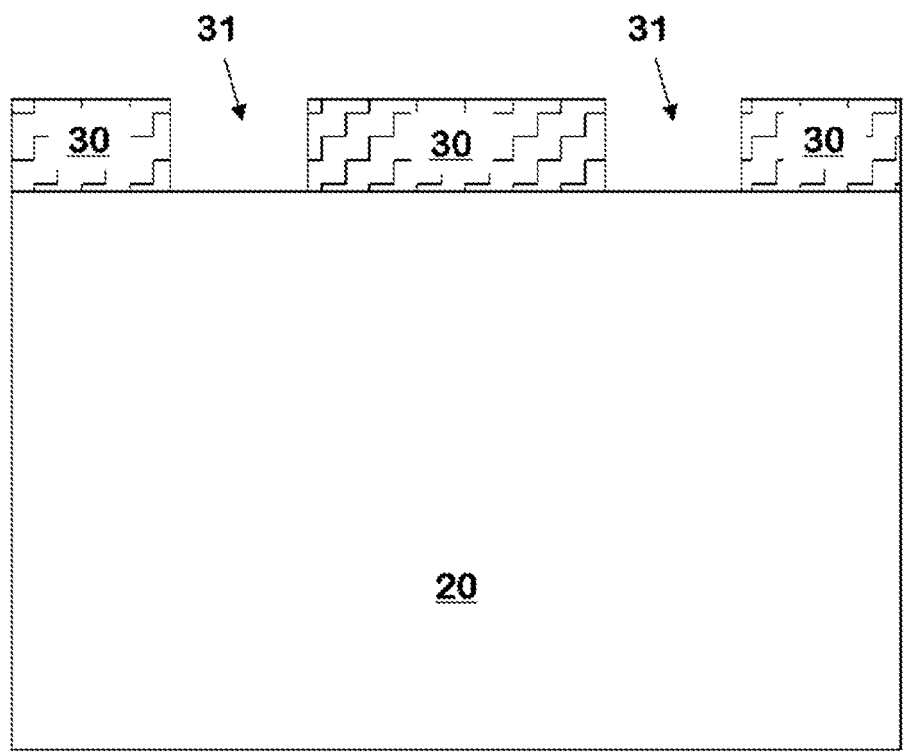
FIGS. 4 to 10 are schematic cross-sectional structure diagrams of main structures in a manufacturing process of one embodiment of a method for manufacturing a semiconductor super-junction device provided in the present disclosure.

Firstly, as shown in FIG. 4, a hard mask layer 30 is formed on a provided n-type epitaxial layer 20, the n-type epitaxial layer 20 is typically a silicon, and the hard mask layer 30 is typically a laminated layer of a silicon oxide layer, a silicon nitride layer, and a silicon oxide layer. A position of a p-type column is defined through a photoetching process, then the hard mask layer 30 is etched, at least one opening 31 is formed in the hard mask layer 30, and the at least one opening 31 corresponds to the position of the p-type column, and a number of the openings 31 (namely a number of the p-type columns) is determined by a specification of the designed semiconductor super-junction device. Two openings 31 are shown in the embodiment of the present disclosure by way of example only.

Figure 5:
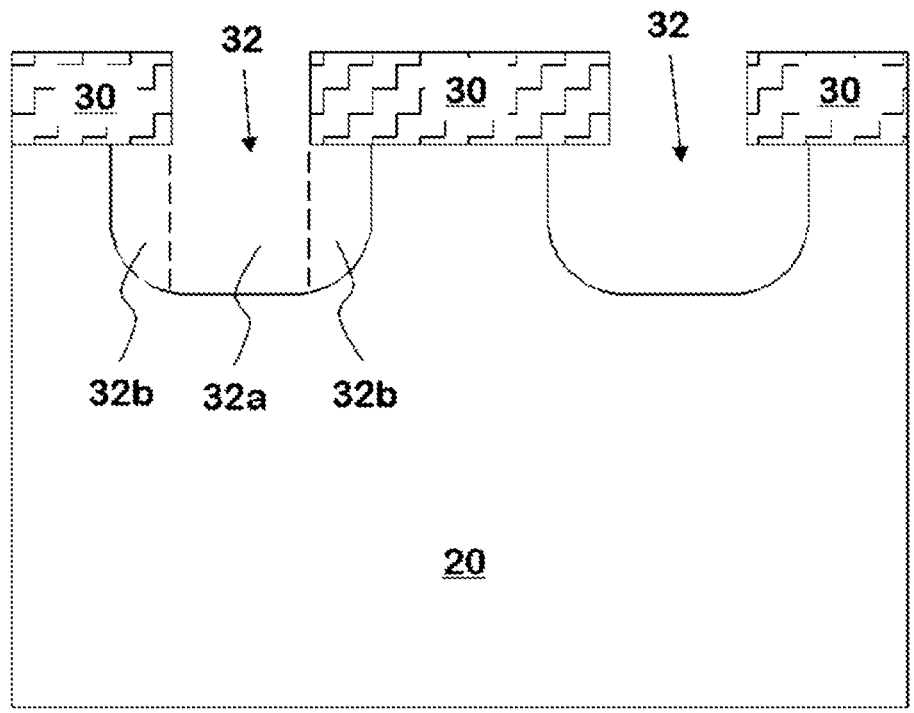

Next, as shown in FIG. 5, the n-type epitaxial layer 20 is etched with the hard mask layer 30 as a mask, a first trench 32 is formed in the n-type epitaxial layer 20, the first trenches 32 are in one-to-one correspondence with the openings in the hard mask layer 30, and the first trench 32 includes a p-type column region 32a located below a corresponding opening and a gate region 32b located on two sides of the p-type column regions 32a. When the first trench 32 is formed through an etching, a method combining an anisotropic etching and an isotropic etching may be selected, for example, the p-type column region 32a of the first trench 32 is formed through an anisotropic etching method, and then the gate region 32b of the first trench 32 is formed through an isotropic etching method.

Figure 6:
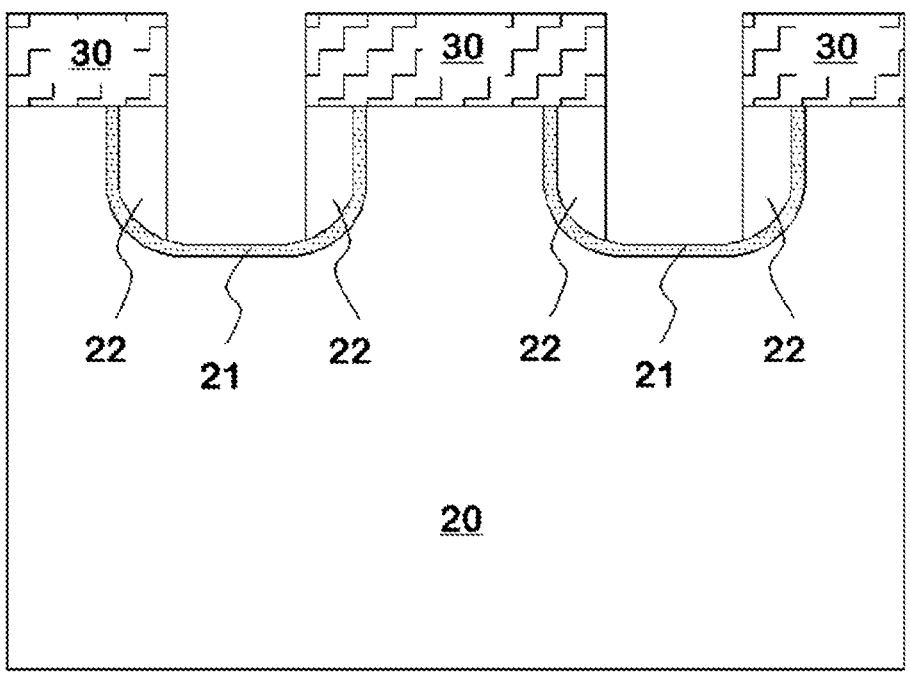

Next, as shown in FIG. 6, a first insulating layer 21 is formed on a surface of the first trench, and the first insulating layer 21 is typically a silicon oxide and is formed by a thermal oxidation method. A first conductive layer is then deposited and etched back so as to form a gate 22 in the gate region of the first trench. When the first conductive layer is deposited, a whole first trench may be filled with the first conductive layer, or the whole first trench may not be filled with the first conductive layer, but the gate region of the first trench is filled with the first conductive layer.

Figure 7:
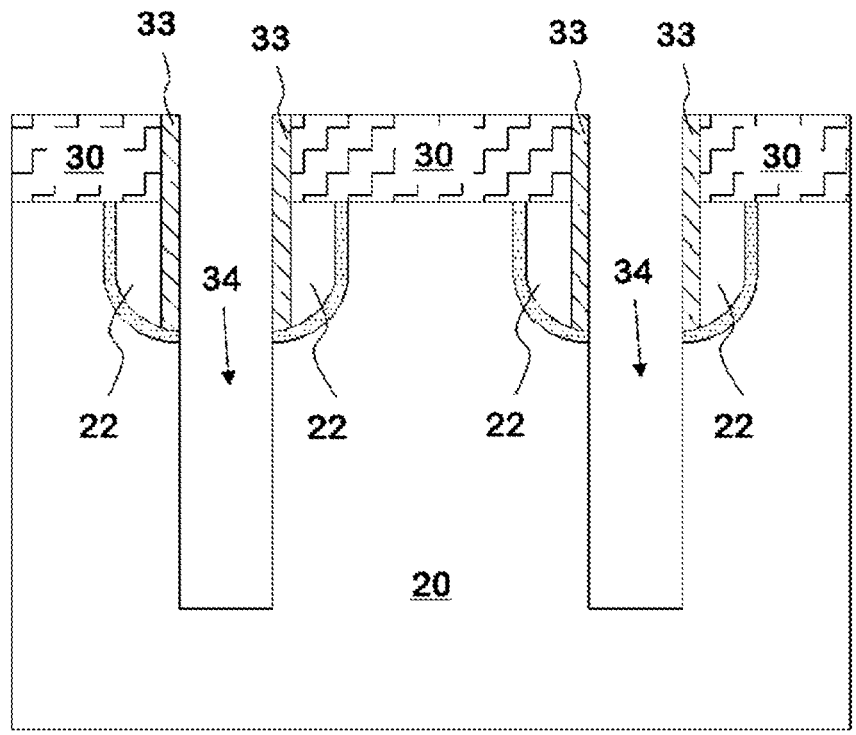

Next, as shown in FIG. 7, an insulating side wall 33 are formed on an exposed side wall of the gate 22, and the insulating side wall 33 typically include a silicon nitride layer. Next, the exposed first insulating layer is etched firstly, then the n-type epitaxial layer 20 is etched continuously with the hard mask layer 30 and the insulating side wall 33 as masks, and a second trench 34 located below the first trench is formed in the n-type epitaxial layer 20. In an embodiment, as shown in FIG. 8, a width of the second trench 34 may be greater than a width of a corresponding p-type column region, and correspondingly, when the second trench 34 is formed through an etching, an etching method combining an anisotropic etching and an isotropic etching may be adopted, exemplarily, the anisotropic etching method may be adopted firstly to perform the etching, and the isotropic etching method may be adopted secondly to perform the etching, so that the width of the second trench 34 is increased, and thus a width of the n-type epitaxial layer between adjacent second trenches 34 is reduced.

Figure 8:
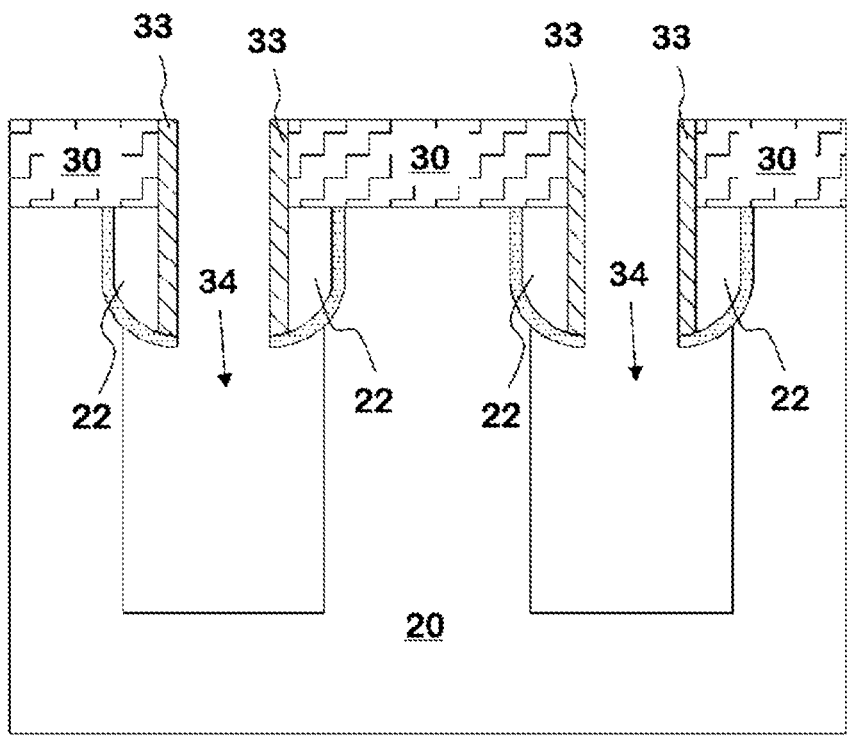

The insulating side wall 33 may extend onto an exposed side wall of the hard mask layer 30, as shown in FIGS. 7 and 8.

Figure 9:
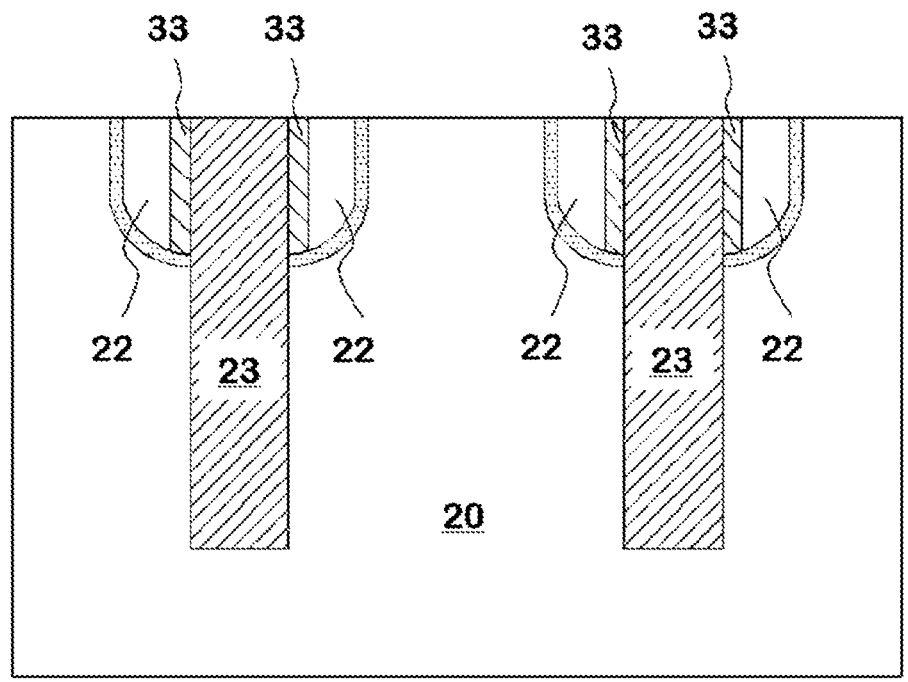

Next, as shown in FIG. 9, a p-type column 23 is formed in the first trench and the second trench, and a pn junction structure is formed between the p-type column 23 and the n-type epitaxial layer 20, so that charge balance is formed, and the p-type column 23 is isolated from the gate 22 by the insulating side wall 33. The p-type column 23 is a p-type polysilicon formed by an epitaxial process may be made of a p-type polycrystalline silicon and is typically formed through an epitaxial process. In an embodiment, a p-type ion implantation may be performed once before the p-type column 23 is formed so as to form a p-type compensation region below the second trench or in the n-type epitaxial layer 20 below the second trench and on two sides of the second trench, which achieves a better charge balance between the p-type column 23 and the n-type epitaxial layer 20.

Figure 10:
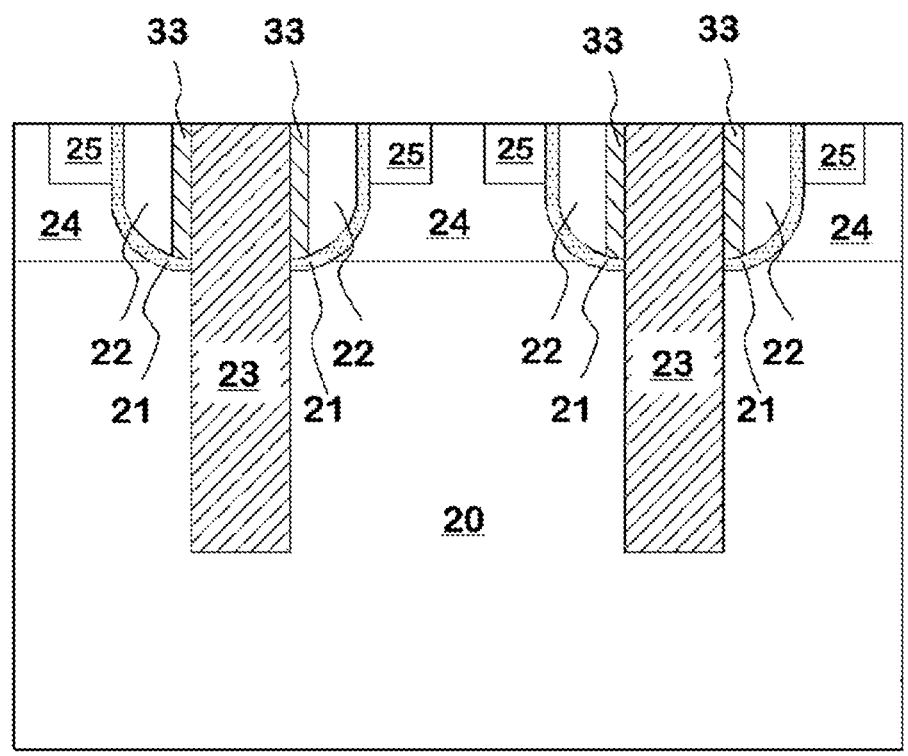

Next, as shown in FIG. 10, a gate dielectric layer 21 and a gate 22 are formed in the gate region of the first trench, and the gate 22 is isolated from the p-type column 23 by the gate dielectric layer 21.

Next, as shown in FIG. 11, a p-type body region 24 is formed in the n-type epitaxial layer 20 according to a conventional process, and an n-type source region 25 is formed in the p-type body region 24.

Finally, an isolation dielectric layer, a metal layer and the like are formed according to a conventional process to obtain the semiconductor super-junction device.

What is claimed is:

1. A method for manufacturing a semiconductor super-junction device, comprising:
    forming a hard mask layer on an n-type epitaxial layer, defining a position of a p-type column through a lithography process, etching the hard mask layer, and forming at least one opening in the hard mask layer, wherein the at least one opening corresponds to the position of the p-type column;
    etching the n-type epitaxial layer with the hard mask layer as a mask, and forming a first trench in the n-type epitaxial layer, wherein a width of the first trench is larger than a width of one opening of the at least one opening corresponding to the first trench, and the first trench comprises a p-type column region located below the opening corresponding to the first trench and a gate region located on two sides of the p-type column region;

forming a first insulating layer on a surface of the first trench, depositing a first conductive layer and etching back the first conductive layer to form a gate in the gate region of the first trench;

forming an insulating side wall on an exposed side wall of the gate, etching the n-type epitaxial layer with the hard mask layer and the insulating side wall as masks, and forming a second trench in the n-type epitaxial layer, wherein the second trench is located below the p-type column region corresponding to the second trench; and forming the p-type column in the p-type column region and the second trench, and forming a pn junction structure between the p-type column and the n-type epitaxial layer, wherein the p-type column is isolated from the gate by the insulating side wall.

2. The method for manufacturing a semiconductor super-junction device of claim 1, further comprising:

forming a p-type body region in the n-type epitaxial layer; and forming an n-type source region in the p-type body region.

3. The method for manufacturing a semiconductor super-junction device of claim 1, wherein the hard mask layer is a laminated layer of a silicon oxide layer, a silicon nitride layer, and a silicon oxide layer laminated layer.

4. The method for manufacturing a semiconductor super-junction device of claim 1, wherein an etching method combining an anisotropic etching and an isotropic etching is adopted during forming the first trench through an etching.

5. The method for manufacturing a semiconductor super-junction device of claim 1, wherein the first conducting layer is made of a polycrystalline silicon.

6. The method for manufacturing a semiconductor super-junction device of claim 1, wherein the formed first conductive layer at least fills the gate region of the first trench during depositing the first conductive layer.

7. The method for manufacturing a semiconductor super-junction device of claim 1, wherein a width of the second trench is greater than a width of the p-type column region corresponding to the second trench.

8. The method for manufacturing a semiconductor super-junction device of claim 7, wherein an etching method combining an anisotropic etching and an isotropic etching is adopted during forming the second trench through an etching.

9. The method for manufacturing a semiconductor super-junction device of claim 1, wherein the insulating side wall comprises a silicon nitride layer.

10. The method for manufacturing a semiconductor super junction device of claim 1, wherein the p-type column is made of a p-type polycrystalline silicon.

* * * * *